United States Patent [19]

Murata et al.

[11] Patent Number: 4,726,849
[45] Date of Patent: Feb. 23, 1988

[54] PHOTOVOLTAIC DEVICE AND A METHOD OF MANUFACTURING THEREOF

[75] Inventors: Kenji Murata; Yasuo Kishi, both of Osaka, Japan

[73] Assignee: Sanyo Electric Co., Ltd, Japan

[21] Appl. No.: 891,733

[22] Filed: Jul. 29, 1986

[30] Foreign Application Priority Data

Aug. 7, 1985 [JP] Japan ................. 60-173684
Oct. 15, 1985 [JP] Japan ................. 60-230552
Jan. 20, 1986 [JP] Japan ..................... 61-9334

[51] Int. Cl.$^4$ .................. H01L 27/14; H01L 31/18
[52] U.S. Cl. ..................... 136/244; 136/258 AM; 437/2; 437/51; 437/173; 437/205
[58] Field of Search ........ 136/244, 258 AM, 249 MS, 136/258 AM; 29/572, 580, 582, 583; 219/121 LJ, 121 LN; 156/643; 437/2, 51, 173, 205

[56] References Cited

U.S. PATENT DOCUMENTS

| | | | |
|---|---|---|---|
| 4,191,794 | 3/1980 | Shirland et al. | 427/74 |
| 4,243,432 | 1/1981 | Jordan et al. | 136/244 |
| 4,428,110 | 1/1984 | Kim | 29/572 |
| 4,443,651 | 4/1984 | Swartz | 136/249 MS |
| 4,517,403 | 5/1985 | Morel et al. | 136/249 MS |
| 4,624,045 | 11/1986 | Ishihara et al. | 29/572 |

FOREIGN PATENT DOCUMENTS

58-18971 2/1983 Japan ..................... 136/244

*Primary Examiner*—Aaron Weisstuch
*Attorney, Agent, or Firm*—Darby & Darby

[57] ABSTRACT

A photovoltaic device comprises a glass substrate, and on a surface of the glass substrate, a plurality of transparent electrodes which define each photoelectric conversion cell are arranged at intervals. At one end of each transparent electrode in the direction of width thereof, a conductor and an insulator are formed so as to extend in parallel in the direction of length of the photoelectric conversion cell with a spacing maintained inbetween, for example, by means of screen printing. On the surface of the glass substrate, a semiconductor photoactive layer composed of amorphous silicon is formed so as to cover the transparent electrode and the conductor and the insulator stripes formed thereon. On the semiconductor photo-active layer, a back electrode composed of aluminum is formed. By irradiating a laser beam onto the insulator from the back electrode side, the irradiated part of the back electrode and the semiconductor photo-active layer thereunder are separated at each photoelectric conversion cell. Also, by irradiating the laser beam onto the conductor from the back electrode side, the irradiated part of the back electrode and the semiconductor photo-active layer thereunder are melted, and the back electrode of each photoelectric conversion cell is connected electrically to the adjacent transparent electrode through the conductor.

36 Claims, 20 Drawing Figures

PHOTOVOLTAIC DEVICE AND A METHOD OF MANUFACTURING THEREOF

BACKGROUND OF THE INVENTION

1. Field of the Invention

The present invention relates to a photovoltaic device and a method of manufacturing thereof. More specifically, the present invention relates to a so-called series type photovoltaic device wherein a plurality of series connected photoelectric conversion cells composed of a semiconductor layer such as amorphous silicon are arranged in a direction of width thereof on a single substrate, and a method of manufacturing thereof.

2. Description of the Prior Art

This kind of photovoltaic device is disclosed, for example, in U.S. Pat. No. 4,281,208, assigned to the same assignee as the present invention. A brief description will be given here of the structure of this photovoltaic device shown in FIG. 1 within the context required for understanding the present invention.

A plurality of photoelectric conversion cells 12a, 12b, 12c, are formed on a glass substrate 10. Transparent electrodes 14a, 14b, 14c, are formed with a constant interval between adjacent photoelectric conversion cells 12a, 12b, 12c. On the respective transparent electrodes 14a, 14b, 14c, semiconductor photo-active layers 16a, 16b, 16c, are formed, which are composed of amorphous silicon or the like. On the semiconductor photo-active layers 16a, 16b, 16c, back electrodes 18a, 18b, 18c, are formed, the ends of which extend to the adjacent transparent electrodes 14b, 14c, to be connected thereto.

The semiconductor photo-active layers 16a, 16b, 16c, comprise, for example, PIN junctions parallel with the film surface respectively, and when the light enters into them through the glass substrate 10 and the transparent electrodes 14a, 14b, 14c, photovoltages are generated in the respective semiconductor photo-active layers 16a, 16b, 16c. The photovoltages generated in the respective photoelectric conversion cells 12a, 12b, 12c, are added in series because the back electrodes 18a, 18b, 18c, are connected to the adjacent transparent electrodes 14b, 14c.

Normally, in order to manufacture a photovoltaic device of such a structure, a photoetching technique for its micro-workability is employed. In the case of employing the photoetching technique, with reference to the example shown in FIG. 1, a transparent electrode layer is formed on the whole of one main surface of the glass substrate 10, and photo-resist films are formed on the parts corresponding to the semiconductor photo-active layers 16a, 16b, 16c, and then etching is performed and thereafter the photo-resist films are removed, and thereby the semiconductor photo-active layers 16a, 16b, 16c, for the respective photoelectric conversion cells 12a, 12b, 12c, are formed.

Such a photoetching technique excels in micro-workability, but is likely to produce defects in the semiconductor photo-active layer due to pinholes produced in the photo-resist film defining the etching pattern, peeling-off at the fringe of the photo-resist film, etc.

Subsequently, a method not employing photoetching techniques was proposed, for example, in U.S. Pat. No. 4,292,092 issued on Sept. 29, 1981. In this Patent, a laser beam is employed. This method which performs patterning by irradiating the laser beam is extremely effective in that micro-working can be made without employing any wet processing.

However, conventional working by means of laser irradiation has the following problems to be solved. Specifically, the working by the laser beam is essentially a heat working, and therefore if another layer is present under the part of layer to be worked, it is important not to damage it. Otherwise, in addition to burning-off the desired part of the layer, the under layer not required to be burnt-off is also burnt-off, or if not so, it thermally damaged. In U.S. Pat. No. 4,292,092 as cited above, in order to meet this requirement, it is proposed that the laser output or the pulse frequency is selected specifically for each film or layer to be worked.

However, even by this prior art method, the workability is still insufficient because of variations of the film thickness of the semiconductor photo-active layer which is inevitably present. Specifically, the absorption factor of the laser beam varies greatly depending upon the thickness of the film or layer to be worked, and therefore the threshold energy density of the laser for scribing is not always constant. For example, in the case of amorphous silicon, the relationships of absorption factor A, reflection factor R, and transmission factor T of the laser beam to the film thickness are as shown in FIG. 2. As is obvious from FIG. 2, for example, in the case of working amorphous silicon films by a Nd:YAG laser of 10.6 $\mu$m wavelength with Q switching, the absorption factor of the laser radiation varies greatly within a range of 5%–20% at a film thickness of 4000 Å or more which is practicable for the photovoltaic device. Accordingly, in the case of working amorphous silicon films by such a YAG laser, when a high laser output is used so as to scribe effectively even if the film thickness is such to give a minimum absorption factor of 5%, a laser beam having an output of four times the threshold energy density is irradiated onto those parts of the film having a thickness corresponding to a maximum absorption factor of 20%. Accordingly, thermal damage to the transparent electrode present under such parts of the amorphous silicon film is unavoidable. Conversely, when a low laser output is employed so that those parts of the film having a thickness corresponding to an absorption factor of 20% can be worked, the laser energy is insufficient at those parts of the film having a thickness corresponding to an absorption factor of 5%. Accordingly, amorphous silicon at those parts is not removed, and remains uncut, resulting in a reduction in output of the photoelectric conversion cell.

Thus, one problem in U.S. Pat. No. 4,292,092 is that since the absorption factor of the laser beam varies greatly depending upon the film thickness of the amorphous silicon film, partial thermal damage is given to the under-layered transparent electrode or the amorphous silicon film at those parts which remain uncut.

U.S. Pat. No. 4,292,092 has another problem, as follows: In general, a metal film such as aluminum is utilized for the back electrode in such a photovoltaic device. FIG. 3 shows the absorption factor A, the reflection factor R, and the transmission factor T in the case of irradiating the laser beam onto such an aluminum back electrode. As is obvious from FIG. 3, 90% or more of the irradiated laser beam is reflected, and therefore a very large laser output is required to scribe it. A laser beam of large output can be used, but the use of a large-output laser beam causes various disadvantages.

For example, as shown in FIG. 4, in the case of a structure wherein the back electrode is separated on the transparent electrode exposed by the semiconductor photo-active layer, for example, the back electrode 18b on the semiconductor photo-active layer 16b is melted due to heating by a laser beam of large output, and a melted part 18ab flows onto the transparent electrode 14b, causing the photoelectric conversion cell 12b to short-circuit. Also, as shown in FIG. 5, in the case of a structure wherein the back electrode is separated on the underlying semiconductor photo-active layer, the parts of the semiconductor photo-active layer 16b bombarded directly by the laser beam of large output are annealed, and the resistance at those parts 16b' is lowered. Consequently, the back electrodes 18a and 18b which may be separated physically from each other are not separated electrically because of the low resistance of the part 16b' of the semiconductor photo-active layer 16b', and accordingly, the open-circuit voltage Voc of the whole photovoltaic device is reduced.

Another laser-beam-applied technique capable of solving one of the problems of U.S. Pat. No. 4,292,092 is disclosed, for example, in U.S. Pat. No. 4,517,403 issued on May 14, 1985. In this Patent, the back electrode of each photo-electric conversion cell is connected in series to the adjacent transparent electrode through silver paste buried in the amorphous silicon. In this Patent, the amorphous silicon layer is not required to be scribed, and therefore the first problem of U.S. Pat. No. 4,292,092 is avoided, namely the problem caused by variation of the laser beam absorption factor due to variation of the film thickness of the amorphous silicon layers. However, this Patent still does not solve the second problem of U.S. Pat. No. 4,292,092, namely scribing of the back electrode.

Also, in copending U.S. Patent Application Ser. No. 749,888 filed June 27, 1985, it is proposed to insert a heat insulating material between the back electrode and the semiconductor photo-active layer in order to remove the deleterious heating effect due to laser-scribing of the back electrode. This Application is characterized in that no damage is given to the underlying semiconductor photo-active layer or the like even when a laser beam of a relatively large output is employed in scribing the back electrode. However, this Application gives no consideration to the change in absorption factor due to the variation of film thickness because the semiconductor photo-active layer itself has been already scribed in the previous process, still leaving the first problem of U.S. Pat. No. 4,292,092.

SUMMARY OF THE INVENTION

Therefore, a principal object of the present invention is to provide a photovoltaic device of a novel structure which can be worked effectively and stably by utilizing an energy beam.

Another object of the present invention is to provide a photovoltaic device wherein separation of the semiconductor photo-active layer and the back electrode and series connection between the back electrode and the transparent electrode can be stably performed.

Still another object of the present invention is to provide a photovoltaic device wherein separation of the semiconductor photo-active layer and the back electrode and series connection between the back electrode and the transparent electrode can be performed virtually in the same process.

Still another object of the present invention is to provide a photovoltaic device which does not require precise adjustment of the energy density or the like of energy beam during scribing.

Still another object of the present invention is to provide a simple method of manufacturing a photovoltaic device.

In brief, the present invention is a photovoltaic device which comprises a substrate having an insulating surface, first electrodes which are formed on the insulating surface of the substrate so as to define a plurality of separate photovoltaic cells, a semiconductor photo-active layer which is formed on the insulating surface of the substrate so as to cover the first electrodes, conductors which are formed at one edge defining the interval between the first electrodes positioned on the first electrodes and under the semiconductor photo-active layer, insulators which are formed adjacent to these conductors, and second electrodes which are formed on the semiconductor photo-active layer, wherein the semiconductor photo-active layers and the second electrodes of adjacent photoelectric conversion cells are separated by irradiating an energy beam onto the insulators from the second electrode side, and the second electrode of each photoelectric conversion cell is connected to the first electrode of the adjacent photoelectric conversion cell through the conductor by irradiating an energy beam onto the conductor part from the second electrode side.

In accordance with the present invention, in separating the second electrode and the semiconductor photo-active layer for each photoelectric conversion cell, separation can be made stably and perfectly without being affected by the film thickness of the semiconductor photo-active layer. In detail, the insulator is disposed under the semiconductor photo-active layer, and in the separating process thereof, an energy beam is irradiated onto this insulator, and therefore, even if the output of the energy beam is set as to be able to scribe those parts of the semiconductor photo-active layer of film thicknesses at which the absorption factor for the energy beam is small, the insulator prevents the energy beam from reaching the underlying first electrode, and therefore no thermal damage is given to such an underlying first electrode. Accordingly, the present invention is completely fee from the conventional problem that the underlying electrode is affected adversely by the variation in the threshold energy density due to variation of the film thickness of the semiconductor photo-active layer and is also free from the problem that the semiconductor photo-active layer cannot be separated completely because of the lack of energy. Consequently, fine adjustment of the energy density of the energy beam to be irradiated can be dispensed with, thus simplifying the manufacturing process.

Also, the insulator can effectively prevent the adjacent second electrodes or the back electrodes from short-circuiting to each other. Specifically, even if the second electrode is caused to melt by the energy beam used for separating each a photoelectric conversion cell, the insulator can prevent this melting from spreading to other parts, and therefore it never happens that the second electrodes are connected to each other through the melted portion.

In a preferred embodiment in accordance with the present invention, the conductor extends in the direction of length of the first electrode, and is formed so that the end thereof in the direction of length is positioned inside from the edge of the first electrode. On the other hand, the insulator extends in the direction of length of the first electrode, and is formed so that the end thereof is positioned outside from the edge of the first electrode. In accordance with this embodiment, no short-circuit is caused between the adjacent photoelectric conversion cells.

In more detail, in the case where the first electrode is formed on the whole surface of the substrate, and thereafter the first electrode is separated to define each photoelectric conversion cell, for example, by the laser beam, the adjacent first electrodes are not separated completely because of the first electrodes material remaining on the side edge of the substrate, and accordingly, if the conductor contacts the remainder, sometimes the conductors are also connected electrically to each other through this part. However, in accordance with this embodiment, the conductor does not extend from the edge of the first electrode, and therefore it never contacts the remaining first electrode, and accordingly, no problem is caused that the conductors between the adjacent photoelectric conversion cells are connected electrically to each other.

Also, since the edge of the first electrode in the direction of length is covered with the insulator, therefore the problem caused by exposure of the first electrode by the patterned semiconductor photo-active layer, for example, a short-circuit of the second electrodes formed on the exposed part of the first electrode in the later process by direct contact, can be prevented.

Such a photovoltaic device can be manufactured by the following steps (a) through (h); (a) A step of preparing a substrate having an insulating surface, (b) a step of forming a plurality of separate first electrode defining each photo-electric conversion cell on the insulating surface of the substrate, (c) a step of forming a semiconductor photo-active layer so as to cover said plurality of first electrodes, (d) a step of forming a second electrode layer on the semiconductor photo-active layer, (e) a step of forming a conductor under the second electrode at or in the vicinity of one edge defining the interval between the first electrodes, (f) a step of forming an insulator adjacent to the conductor under the second electrode, (g) a step of separating the semiconductor photo-active layer and the second layer for each photoelectric conversion cell by irradiating an energy beam onto the insulator from the second electrode side, and (h) a step of connecting the second electrode of each photoelectric conversion cell to the first electrode of the adjacent photoelectric conversion cell through the conductor by irradiating an energy beam onto the conductor from the second electrode side.

Meanwhile, the conductors and the insulators are formed in parallel and with intervals kept in the direction of width of the photoelectric conversion cells. In this case, the process of separating the photoelectric conversion cells by irradiating the energy beam onto the insulator and the process of connecting the second electrode to the first electrode of the adjacent photoelectric conversion cell by irradiating the energy beam onto the conductor are carried out. However, the conductor and the insulator may be formed so as to contact each other, and in this case, irradiation of the energy beam for the above-described two step process can be reduced to only one time. Also, formation of the conductor and the insulator contacting with each other has an advantage that the degree of integration in the direction of width of the photoelectric conversion cell can be improved.

Furthermore, the insulators may be formed so as to sandwich the conductor. In this case, the irradiation of the energy beam can also be reduced to only one time. Also, in the case of forming the insulators so as to sandwich the conductor, one of the insulators sandwiching the conductor may be formed at the interval between the first electrodes. Thereby, the interval between the first electrodes is filled with the insulator, and thereby leakage current between the adjacent photoelectric conversion cells can be suppressed, and therefore the degree of integration in the direction of width of the photoelectric conversion cell can be further raised by narrowing the intervals.

In many cases, the first electrode is formed on the whole insulating surface of the substrate, and the first electrode is separated corresponding to a plurality of photoelectric conversion cells as mentioned above, and the conductors are formed on the separated first electrodes, respectively. However, the conductors may be formed under the first electrode before separation. Then, the conductors can be formed by sintering a conductor paste. For example, the screen printing method can be employed for forming the conductor paste.

Also, the insulators are formed under the semiconductor photo-active layer. However, the insulators may be formed on the semiconductor photo-active layer. In any case, the insulators can be formed by sintering the insulator paste. Then, the insulator paste is formed, for example, by screen printing.

These objects and other objects, features, aspects and advantages of the present invention will become more apparent from the following detailed description of the embodiments of the present invention when taken in conjunction with accompanying drawings.

DESCRIPTION OF THE PREFERRED EMBODIMENTS

Description will now be made of one embodiment in accordance with the present invention with reference to FIG. 6 through FIG. 10. In the first process of this embodiment, a transparent substrate 10 such as glass of about 1-5 mm in thickness and 10 cm by 10 cm to 50 cm by 50 cm in area is prepared. Then, a single layered or laminated multi-layer transparent conductive oxide (TCO) of 2,000 Å–5,000 Å in thickness typified by tin oxide ($SnO_2$) or indium tin oxide (ITO) is formed on the whole of one main surface of this substrate 10.

Thereafter, a laser beam is irradiated onto interval portions 14ab, 14bc, corresponding to intervals between respective photoelectric conversion cells 12a, 12b, 12c, and the transparent electrode layers at these parts are removed to form individual transparent electrodes 14a, 14b, 14c, respectively. A laser device which generates a laser beam of a wavelength which is not significantly absorbed by the substrate 10 is suitable for this use, and in the case where the substrate 10 is glass, a pulse-output type laser device of 0.35 μm–2.5 μm in wavelength is suitable. In the embodiment, a Q switched Nd: YAG laser of about 1.06 μm in wavelength, 13 $J/cm^2$ in energy density, and 3 KHz in pulse frequency was employed.

Figure 7:
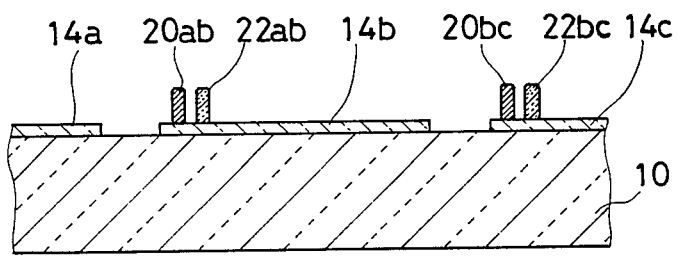

In the process shown in FIG. 7, conductors 20ab, 20bc, and insulators 22ab, 22bc, are formed on the transparent electrodes 14b, 14c, in the vicinity of the interval portions 14ab, 14bc, between the transparent electrodes 14a, 14b, 14c, which are separated from one another. As shown in detail in FIG. 7A, the conductors 20ab, 20bc, are formed at the side near the adjacent interval portions 14ab, 14bc, so as to extend in parallel with the direction of length of the photoelectric conversion cells 12a, 12b, 12c, and with intervals spaced from these in the direction of width of the photoelectric conversion cells 12a, 12b, 13c, the insulators 22ab, 22bc, are formed in the same manner.

For the conductors 20ab, 20bc, for example, silver paste or another low-temperature-fired type metal paste is used. Also, for the insulators 22ab, 22bc, a paste-like material which does not diffuse into an amorphous silicon film which is formed in the later process and functions as a semiconductor photo-active layer 16, for example, $SiO_2$ paste wherein silicon dioxide ($SiO_2$) powder is formed into a paste or another paste of inorganic material is selected.

These conductors 20ab, 20bc, and insulators 22ab, 22bc, are both patterned to be 10–20 μm in height and 100–150 μm in width, for example, by screen printing method, and thereafter undergo preliminary drying, being fired at a temperature of about 550° C.

When the firing temperatures for the conductors 20ab, 20bc, and for the insulators 22ab, 22bc, are the same as mentioned above, both are fired simultaneously. However, even when both are fired simultaneously, the conductors and the insulators cannot be screen printed simultaneously, and therefore it is required that the conductor paste or the insulator paste is first screen-printed, and subsequently the preliminary drying is applied to this screen-printed paste, and thereafter the remaining insulator paste or conductor paste is screen-printed.

The conductor paste and insulator paste can also be printed or formed, for example, by the pen-drawing method.

Figure 7A:
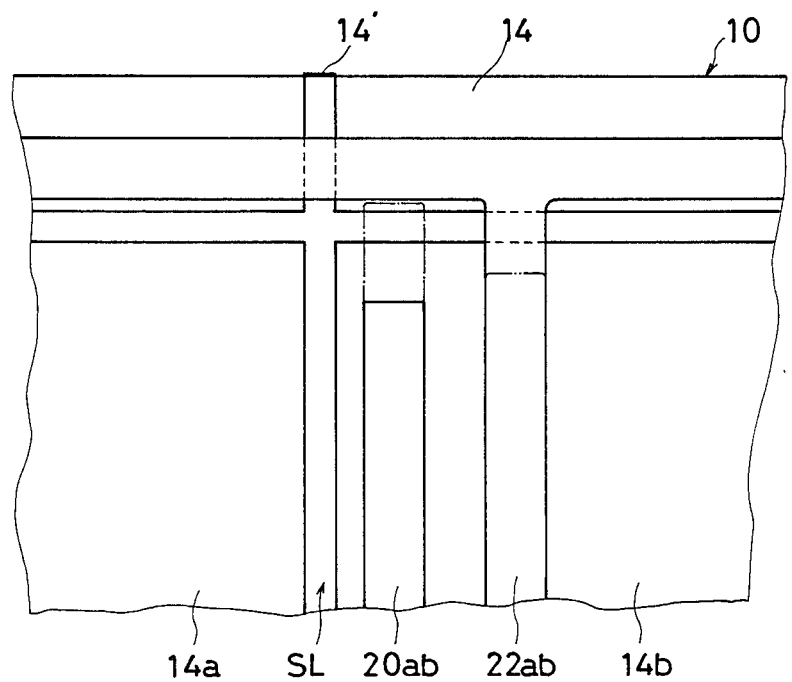
FIG. 7A is a magnified fragmental plan view for explaining formation of the conductor and the insulator in the process in FIG. 7.

Also, in the process of FIG. 7, as shown in FIG. 7A, the conductors 20ab, 20bc, are formed so as to be positioned inside from the ends of the transparent electrodes 14b, 14c, in the direction of length of the photoelectric conversion cells 12a, 12b, 12c. This means that the conductors 20ab, 20bc, are formed so as not to extend from the ends in the direction of length of the transparent electrodes 14b, 14c, whereon the respective conductors are formed. Conversely, the insulators 22ab, 22bc, are formed so as to extend from the ends of the transparent electrodes 14b, 14c, in the direction of length thereof.

The reason for forming the conductors 20ab, 20bc, in such a shape is as follows: The transparent electrode is formed on the whole surface of the substrate 10, thereafter being laser-scribed at a scribe line SL as shown in FIG. 7A. At this time, the transparent electrode 14 remains on the edge of the substrate 10, and the adjacent transparent electrodes are connected to one another by a segment 14' of the transparent electrode 14 remaining on the side edge of the substrate 10. In such a case, if the conductor 20ab extends from the transparent electrode 14b as shown by a dash-dot line in FIG. 7A, the extending portion of the conductor is connected electrically to the adjacent transparent electrode and thus to the conductor thereon through the remaining transparent electrode portion 14'.

On the other hand, the reason for forming the insulators 22ab, 22bc, so as to extend from the edges of the transparent electrodes 14a, 14b, 14c, in the direction of length of the photoelectric conversion cells 12a, 12b, 12c, is that if the end of the insulator 22ab is positioned inside the transparent electrode 14b as shown by a dash-colon line in FIG. 7A, the transparent electrode is exposed at that portion by the insulator 22ab, and the back electrode to be formed in the later processing is electrically connected directly to the transparent electrode at that portion by irradiation of the laser beam.

Figure 8:
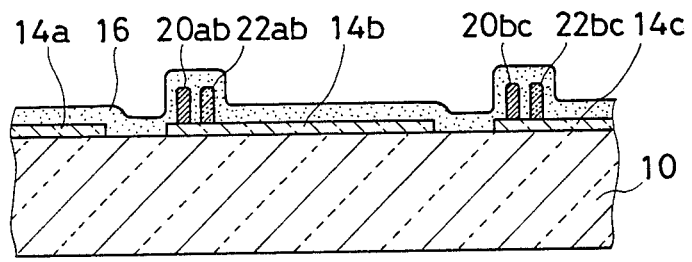

Next, as shown in FIG. 8, a semiconductor photoactive layer 16 is formed on nearly the whole of the main surface of the substrate 10 so as to cover the respective transparent electrodes 14a, 14b, 14c, the conductors 20ab, 20bc, and the insulators 22ab, 22bc. This semiconductor photo-active layer 16 is formed of an amorphous semiconductor, for example, amorphous silicon, and the film thickness thereof is selected at 4,000 Å–7,000 Å so as to contribute effectively to photoelectric conversion.

The semiconductor photo-active layer 16 comprises, for example a PIN junction parallel with the film surface. Such a PIN junction is formed by the plasma CVD method or the photo CVD method in a reaction gas composed of a main gas of a silicon compound such as monosilane ($SiH_4$), disilane ($Si_2H_6$), silicon tetrafluoride ($SiF_4$) or monofluorosilane ($SiH_3F$) and a doping gas such as diborane ($B_2H_6$) or phosphine ($PH_3$) which is added suitably for controlling the conductivity type. Specifically, diborane and a further hydrocarbon gas such as methane ($CH_4$) or ethane ($C_2H_6$) is added to the silicon compound gas as described above, and thereby P-type amorphous silicon carbide (a-SiC) is formed using the plasma CVD method or the photo CVD method, and subsequently I-type amorphous silicon (a-Si) is formed, and further N-type amorphous silicon or microcrystalline silicon (μc-Si) is formed.

Also, for the semiconductor photo-active layer 16, a film-shaped semiconductor such as cadmium sulfide (CdS), cadmium telluride (CdTe), or selenium (Se) may be used, in addition to the amorphous silicon family of semiconductors as described above. Practically, however, the above-described amorphous silicon and amorphous silicon carbide, and further the amorphous silicon family semiconductors typified by amorphous silicon germanium (a-SiGe) or amorphous silicon tin (a-SiSn) are suitable for this layer.

Figure 9:
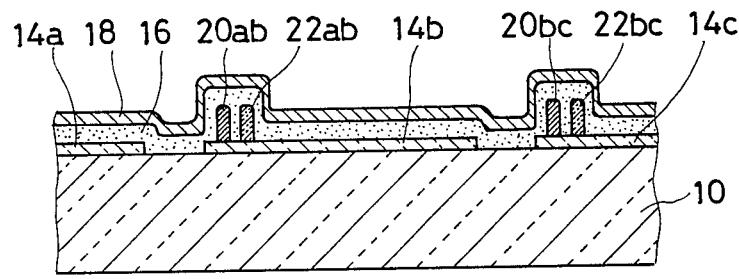

In the process as shown in FIG. 9, the semiconductor photo-active layer 16 formed in the process in FIG. 8 is not scribed. That is, immediately after forming the semiconductor photo-active layer 16, a back electrode layer 18 having, for example, a film thickness of about 1000 Å-2 μm is formed on the main surface of the substrate 10 including the semiconductor photo-active layer 16 and the respective exposed portions of the transparent electrodes 14a, 14b, 14c. For such a back electrode 18, a single-layer structure of aluminum, a double-layer laminate structure of aluminum and titanium (or titanium-silver alloy) or a dual structure including both such double-layer structures in stacked fashion is used.

Thus, the back electrode 18 is formed on the entire surface of the semiconductor photo-active layer 16 immediately after formation thereof, and therefore not only adhesion of dust and dirt onto the semiconductor photo-active layer 16 can be effectively prevented, but also an increase in sheet resistance due to re-adhesion of the debris scattered during scribing performed in the later processing, and further a deterioration in film characteristics of the semiconductor photo-active layer 16 due to moisture in the oxidizing air, can be effectively prevented.

Figure 10:
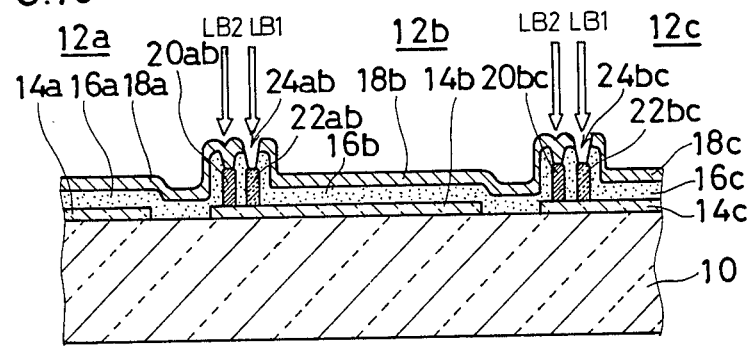

In the final process shown in FIG. 10, two laser beams LB1 and LB2 are irradiated onto the portion of the semiconductor photo-active layer 16 and back electrode 18 laminate located on the conductors 20ab, 20bc, and the insulators 22ab, 22bc, from the side of the back electrode 18.

The portions whereon the first laser beam LB1 is irradiated are the portions to be removed so as to divide the lamination of the semiconductor photo-active layer 16 and the back electrode 18 extending over a plurality of photoelectric conversion cells 12a, 12b, 12c, corresponding to the respective photoelectric conversion cells 12a, 12b, 12c, and these portions are the positions directly over the insulators 22ab, 22bc. Then, the energy density of the first laser beam LB1 is set to an energy density sufficient to remove those portions of the semiconductor photo-active layer 16 and back electrode 18 lamination. Even if the energy density of the laser beam LB1 is set at a higher level, the laser beam LB1 having such a high energy density reaches only the surfaces of the insulators 22ab, 22bc, and never reaches the underlying transparent electrodes 14a, 14b, 14c, because of the presence of the insulators 22ab, 22bc, whose thickness (height) is sufficiently large beneath the above-described laminated portion. Then, the lamination of the semiconductor photo-active layer 16 and the back electrode 18 is separated completely, corresponding to the respective photoelectric conversion cells 12a, 12b, 12c, by the separating grooves 24ab, 24bc, formed therein by means of irradiation of the laser beam LB1.

On the other hand, the energy density of the second laser beam LB2 irradiated onto the conductors 20ab, 20bc, is set to an energy density sufficient to melt the portion of the semiconductor photo-active layer 16 and back electrode 18 lamination over the conductors 20ab, 20bc. Then, the silicide alloy produced by melting contacts the conductors 20ab, 20bc, located beneath so as to penetrate the intervening semiconductor photo-active layer 16. As is described above, the conductors 20ab, 20bc, are metal conductors formed by sintering silver paste or another metal paste, and therefore they are strongly bonded to the melt containing metal. Also, since these conductors 20ab, 20bc, have a sufficient thickness (height), the underlying transparent electrodes 14b, 14c, are never damaged by the second laser beam LB2.

In the process shown in FIG. 10, a single laser device can be employed for irradiating the two laser beam LB1 and LB2 having different energy densities as described above. For example, the same laser device can be employed by varying the focus position to adjust the respective spot diameters of the laser beams LB1 and LB2, or by adjusting the output by means of an attenuator. Furthermore, if the laser device has a sufficient output, one laser beam can be split into the two laser beams LB1 and LB2, for example, by means of a beam splitter or the like. In this case, the number of times of laser beam scanning will be halved.

Thus, the process of removing the unnecessary portions of the semiconductor photo-active layer 16 and the back electrode 18 thereby to separate them corresponding to the respective photoelectric conversion cells 12a, 12b, 12c, and the process wherein the back electrodes 18a, 18b, 18c, and the transparent electrodes 14b, 14c, of the adjacent photoelectric conversion cells 12b, 12c, are connected electrically can be accomplished virtually by the same process.

After undergoing the process shown in FIG. 10, the adjacent back electrodes 18a, 18b, 18c, and transparent electrodes 14b, 14c, of the respective photoelectric conversion cells 12a, 12b, 12c, are connected electrically at the side nearer to the adjacent interval portions 14ab, 14bc, (FIG. 6) by means including the above-described separating grooves 24ab, 24bc. Accordingly, the respective photoelectric onversion cells 12a, 12b, 12c, are electrically connected in series through these back electrodes 18a, 18b, 18c, conductors 20ab, 20bc, and transpaent electrodes 14b, 14c, and thereby a photovoltaic device 10 is completed.

Figure 11:
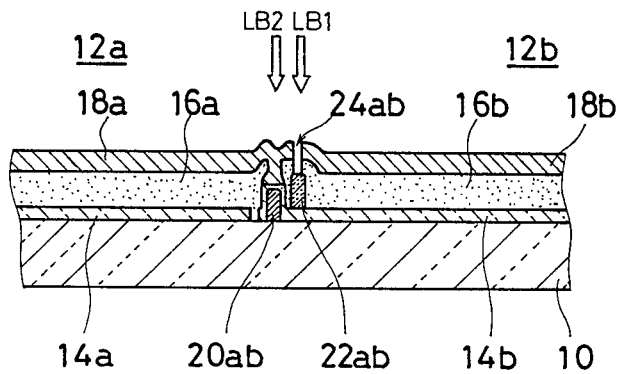
FIG. 11 and FIG. 12 are magnified fragmental sectional views showing modified examples of this embodiment.
Figure 12:
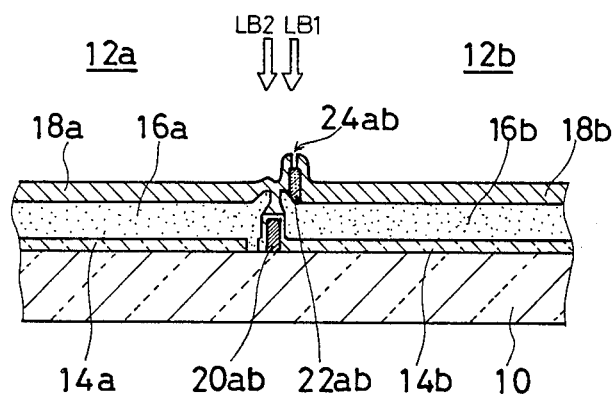

FIG. 11 and FIG. 12 show modified examples respectively, characterized in that the conductor 20ab is formed on a predetermined position of the substrate 10 before the transparent electrodes 14a, 14b, are formed, and accordingly this conductor 20ab is covered by the transparent electrode 14b.

In the embodiment in FIG. 11, the insulator 22ab is covered with the semiconductor photo-active layer 16b as in the previous embodiment. On the other hand, in the embodiment in FIG. 12, the insulator 22ab is formed on the semiconductor photo-active layer 16b.

However, in any of these embodiments, formation of the separating groove 24ab separating the back electrode 18 is performed by irradiating the first laser beam LB1 onto the insulator 22 from the back electrode 18 side, and electrical connection between the adjacent back electrode 18a and transparent electrode 14b is performed by irradiation of the second laser beam LB2 onto the conductor 20ab.

Figure 13:
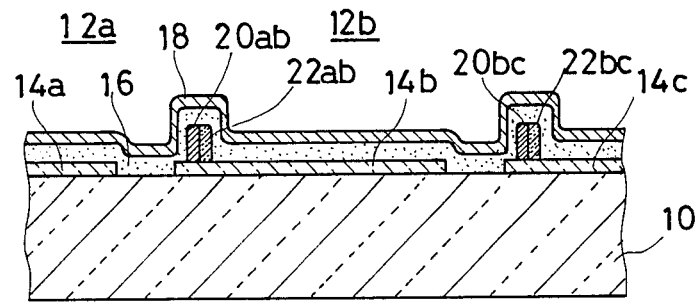
FIG. 13 and FIG. 14 are cross-sectional views showing another embodiment in accordance with the present invention in the sequence of manufacturing processes.
Figure 14:
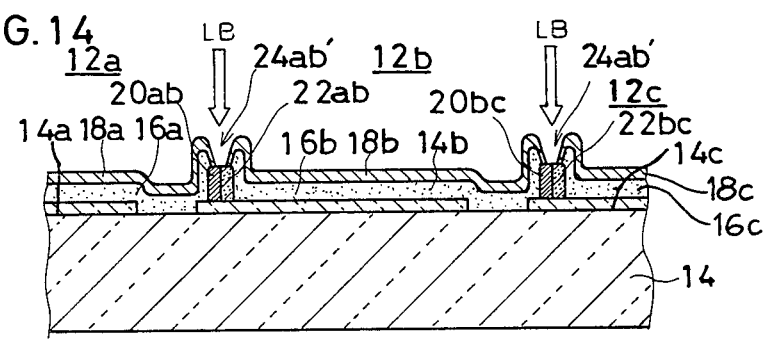

FIG. 13 and FIG. 14 are cross-sectional views showing another embodiment in accordance with the present invention, being equivalent to FIG. 9 and FIG. 10, respectively. In this second embodiment, unlike the previous embodiment, the conductors 20ab, 20bc, and the insulators 22ab, 22bc, are formed so as to contact each other.

Then, as is obvious from FIG. 14, for example, a laser beam LB of 100-150 μm in beam width is irradiated from the back electrode 18 side so as to spread over both of the conductors 20ab, 20bc, and the insulators 22ab, 22bc. Then, the lamination of the semiconductor photo-active layer 16 and the back electrode 18 over the insulators 22ab, 22bc, is removed, and the lamination is separated corresponding to the respective photoelectric conversion cells 12a, 12b, 12c. Also, as in the previous embodiment, the adjacent back electrode 18a and transparent electrode 14b, and also the adjacent back electrode 18b and transparent electrode 14c are electrically connected respectively by the melt produced by melting of the semiconductor photo-active layer 16 and the back electrode 18, that is, silicide alloy produced over the conductors 20ab, 20bc.

In accordance with the embodiment as shown in FIG. 13 and FIG. 14, only a single irradiation or scanning of the laser beam is required, and the manufacturing process thereof is further simplified in comparison with that of the previous embodiment.

Description is now made of the last embodiment in accordance with the present invention with reference to FIG. 15 through FIG. 19. In the first process shown in FIG. 15 of this embodiment, as in the first embodiment, a transparent substrate 10 such as glass is prepared. Then, a transparent conductive oxide (TCO) layer of 2,000 Å-5,000 Å in thickness is formed on the whole of one main surface of the substrate 10. Thereafter, a laser beam is irradiated onto the interval portions 14ab, 14bc, corresponding to the intervals between the respective photoelectric conversion cells 12a, 12b, 12c, and the transparent electrodes of these portions are removed to form the individual transparent electrodes 14a, 14b, 14c.

Figure 1:
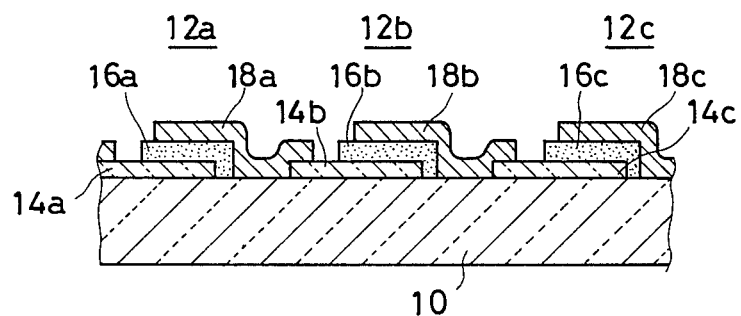
FIG. 1 is a cross-sectional view showing a basic structure of a photovoltaic device which is the background of the present invention and whereto the present invention is applicable.
Figure 2:
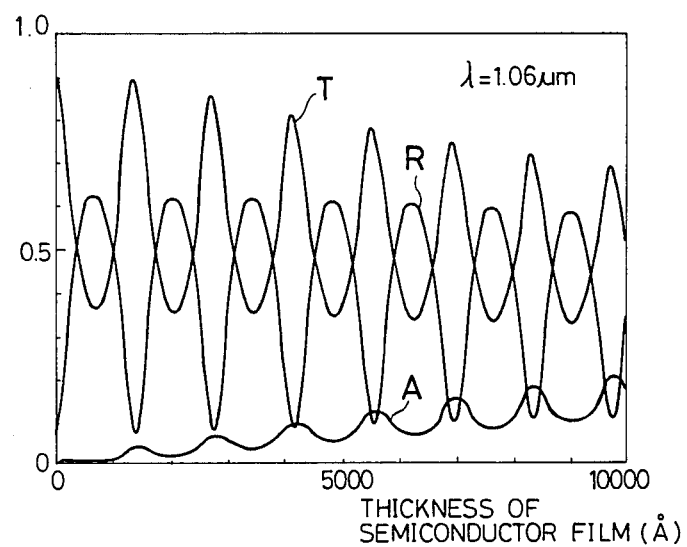
FIG. 2 is a graph for optically analyzing the dependence of the absorption factor A, the reflection factor R, and the transmission factor T of the laser beam on the film thickness of the semiconductor photo-active layer.
Figure 3:
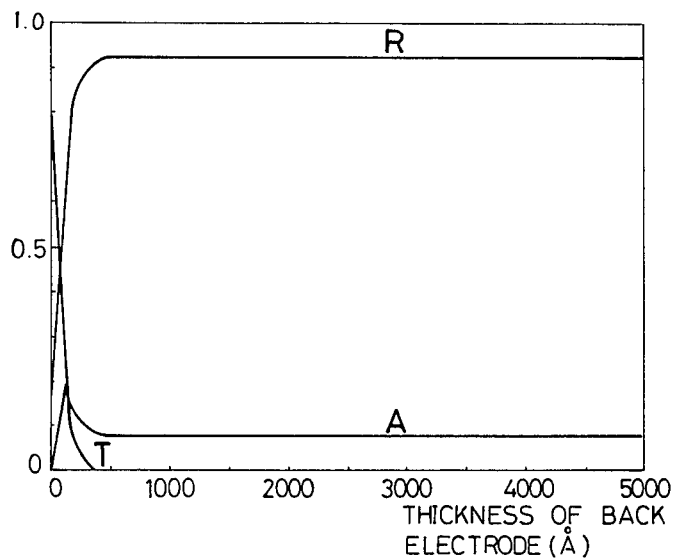
FIG. 3 is a graph for optically analyzing the dependence of the absorption factor A, the reflection factor R, and the transmission factor T of the lase beam on the film thickness of the back electrode.
Figure 4:
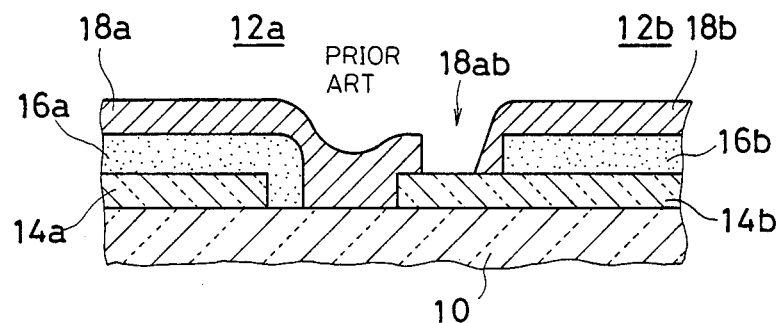
FIG. 4 and FIG. 5 are magnified fragmental sectional views for explainig conventional defects, respectively.
Figure 5:
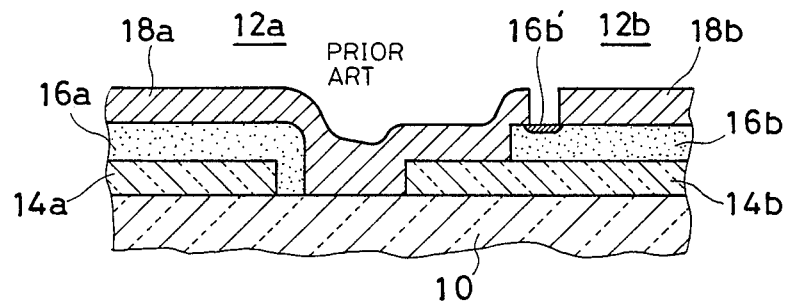
Figure 6:
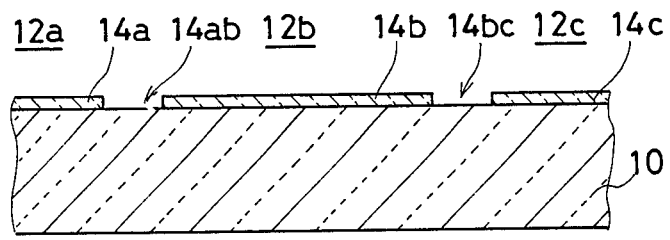
FIG. 6 through FIG. 10 are cross-sectional views showing one embodiment in accordance with the present invention in the sequence of manufacturing processes.
Figure 15:
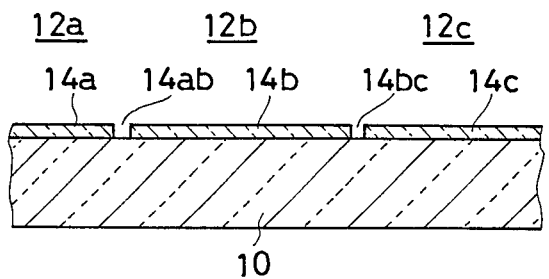
FIG. 15 through FIG. 19 are cross-sectional views showing still another embodiment in accordance with the present invention in the sequence of manufacturing processes.

In the process shown in FIG. 6, the conductors 20ab, 20bc, are formed on the transparent electrodes 14a, 14b, 14c, in the vicinity of the intervals 14ab, 14bc, between the transparent electrodes 14a, 14b, 14c, formed in the process of FIG. 15. Furthermore, the insulators 22ab, 22ab', are formed on the adjacent interval portions 14ab, 14bc, and transparent electrodes 14b, 14c, so as to sandwich the conductors 20ab, 20bc. These conductors 20ab, 20bc, and insulators 22ab, 22ab', 22bc, 22bc', are formed so as to extend in parallel with the direction of length of the photoelectric conversion cells 12a, 12b, 12c.

For the conductors 20ab, 20bc, for example, silver paste or other low-temperature-fired type metal paste is used. Also, for the insulators 22ab, 22ab', 22bc, 22bc', $SiO_2$ paste or another paste of inorganic metal is selected.

In addition, it is desirable that the respective tips of the insulators 22ab, 22ab', 22bc, 22bc', extend onto the conductors 20ab, 20bc. By forming them in such a shape, the conductors 20ab, 20bc, are wrapped by the insulators, and thereby an advantage is obtained in that migration of silver and diffusion of the same into the semiconductor photo-active layer can be effectively prevented.

These conductors 20ab, 20bc, and insulators 22ab, 22ab', 22bc, 22bc', are patterned to be 10-20 μm in height and 100-200 μm in width, for example, by the screen printing method as in the previous embodiment, thereafter being fired at a temperature of about 550° C.

Figure 16:
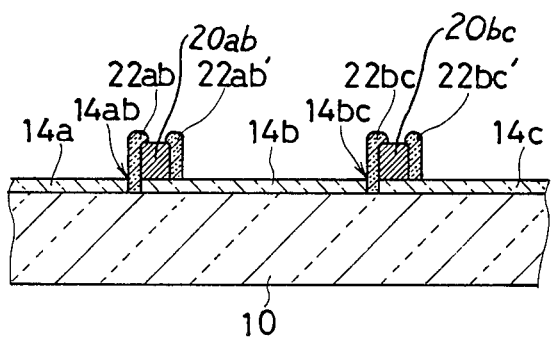

Also, in the process in FIG. 16, as described in FIG. 7A, the conductors 20ab, 20bc, are formed so as to be positioned inside from the ends in the direction of length of the transparent electrodes 14b, 14c. Conversely, the insulators 22ab, 22ab', 22bc, 22bc', are formed so as to extend from the ends in the direction of length of the transparent electrodes 14b, 14c.

Figure 17:
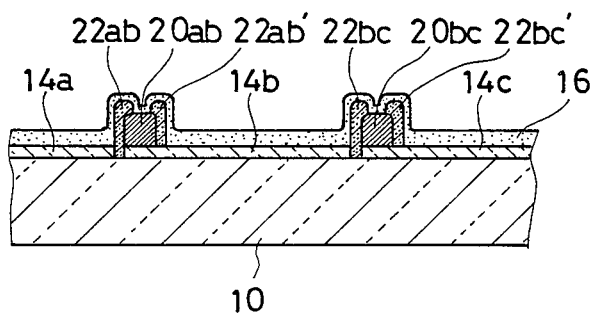

Next, as shown in FIG. 17, the semiconductor photo-active layer 16 is formed on nearly the entire main surface of the substrate 10 so as to cover the respective transparent electrodes 14a, 14b, 14c, the conductors 20ab, 20bc, and the insulators 22ab, 22ab', 22bc, 22bc'. This semiconductor photo-active layer 16, as in the previous embodiment, is formed, for example, by an amorphous semiconductor such as amorphous silicon, and the film thickness thereof is selected to be 4,000 Å-7,000 Å so as to contribute effectively to the photoelectric conversion.

Figure 18:
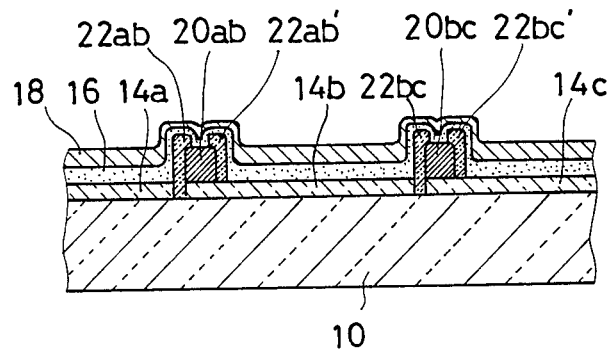

In the process as shown in FIG. 18, the semiconductor photo-active layer 16 formed in the process of FIG. 17 is not scribed, and immediately after the semiconductor photo-active layer 16 is formed, the back electrode 18 having a film thickness of, for example, about 1,000 Å-2 μm is formed on the main surface of the substrate 10 including the semiconductor photo-active layer 16 and the respective exposed portions of the transparent electrodes 14a, 14b, 14c.

Figure 19:
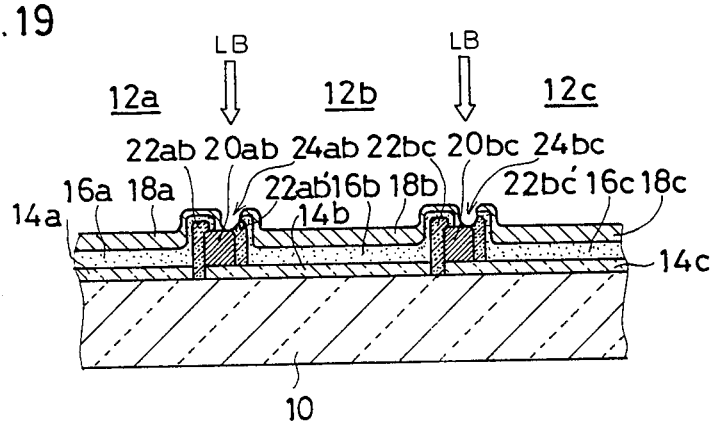

In the final process shown in FIG. 19, the laser beam LB is irradiated onto the positions where the conductors 20ab, 20bc, and the insulators 22ab', 22bc', are superposed on each other, that is, onto portions of the lamination of the semiconductor photo-active layer 16 and the back electrode 18 from the back electrode 18 side. The portions whereon this laser beam LB is irradiated are the portions to be removed so as to split the lamination of the semiconductor photo-active layer 16 and the back electrode 18 extending over a plurality of photoelectric conversion cells 12a, 12b, 12c, corresponding to the respective photoelectric conversion cells 12a, 12b, 12c. The energy density of the laser beam LB is set to an energy density sufficient to remove the laminated portions. Even if the energy density of the laser beam is set to a higher level, the laser beam of such a high energy density is prevented from reaching the underlying transparent electrodes 14a, 14b, 14c, because of the presence of the conductors 20ab, 20bc, and the insulators 22ab', 22bc', whose thickness (heights) are sufficiently large beneath the above-described laminated portions. Then, by this irradiation of the laser beam LB, the lamination of the semiconductor photo-active layer 16 and the back electrode 18 is separated completely, corresponding to the respective photoelectric conversion cells 12a, 12b, 12c, by the separating grooves 24ab, 24bc, formed therein.

On the other hand, since the laser beam LB has a sufficiently large energy density, the back electrodes 18a, 18b, 18c, in the vicinity of the separating grooves 24ab, 24bc, are melted by the irradiation thereof. Such melting of the back electrodes 18a, 18b, 18c, takes place at both sides of the separating grooves 24ab, 24bc, and the melt droops in the direction of narrowing the separating grooves 24ab, 24bc, reaching the conductors 20ab, 20bc, and the insulators 22ab', 22bc'. Consequently, the back electrodes 18a, 18b, 18c, are connected electrically to the transparent electrodes 14b, 14c, of the adjacent photoelectric conversion cells 12a, 12b, 12c, through the conductors 20ab, 20bc, as in the previous embodiment.

Meanwhile, the insulators 22ab, 22bc, formed at the interval portions 14ab, 14ac, serve to suppress leakage currents between respective photoelectric conversion cells. In more detail, the insulators 22ab, 22bc, are inserted between the respective photoelectric conversion cells 12a, 12b, 12c, and therefore no leakage current is produced if the intervals between the transparent electrodes 14a, 14b, 14c, are narrowed to raise the degree of integration.

Although the present invention has been described and illustrate in detail, it is clearly understood that the same is by way of illustration and example only and is not to be taken by way limitation, the spirit and scope of the present invention being limited only by the terms of the appended claims.

What is claimed is:

1. A photovoltaic device of the type including a plurality of photoelectric conversion cells formed as an array on a substrate having an insulating surface, each cell including a first electrode, an active semiconductor layer and a second electrode, said array comprising:
    a plurality of spaced apart first electrodes formed on said insulating surface of said substrate so as to define a plurality of separate photoelectric conversion cells;
    an elongated electrical conductor formed in contact with each said first electrode near an edge thereof adjacent the space between each adjacent pair of said first electrodes;
    at least one elongated insulator each formed so as to be proximate a respective one of said conductors;
    a semiconductor photo-active layer formed on said substrate so as to cover said first electrodes and said conductors; and
    a second electrode layer formed on said semiconductor photo-active layer,
    wherein, said semiconductor photo-active layer and said second electrode layer are separated to define each photoelectric conversion cell by irradiating an energy beam onto said insulators from above said second electrode, and
    the second electrode of each photoelectric conversion cell being connected to the first electrode of an adjacent photoelectric conversion cell through said electrical conductor by irradiating an energy beam onto each said conductor from above each said second electrode.

2. A photovoltaic device in accordance with claim 1, wherein said conductors extend along the length of said first electrodes and terminate inwardly of said first electrodes in the direction of length thereof.

3. A photovoltaic device in accordance with claim 1, wherein said insulators extend along the length of said first electrodes and beyond the first electrodes in the direction of length thereof.

4. A photovoltaic device in accordance with claim 1, wherein said conductors and said insulators extend along the length of said first electrodes.

5. A photovoltaic device in accordance with claim 4, wherein said conductors and said insulators are spaced apart and substantially parallel.

6. A photovoltaic device in accordance with claim 4, wherein at least one of said conductors and at least one of said insulators are in contact.

7. A photovoltaic device in accordance with claim 4, wherein pairs of said insulators sandwich ones of said conductors.

8. A photovoltaic device in accordance with claim 7, wherein one of said insulators sandwiching said conductors is in a space between said first electrodes.

9. A photovoltaic device in accordance with claim 1, wherein said conductors are formed by sintering a conductive paste.

10. A photovoltaic device in accordance with claim 1, wherein said insulators are formed by sintering an insulating paste.

11. A method for fabricating a plurality of photoelectric conversion cells in a photovoltaic device including a substrate with an insulating surface, said method comprising the steps of:
    (a) forming a plurality of spaced apart first electrodes corresponding to a plurality of photoelectric conversion cells on said insulating surface of said substrate,
    (b) forming an elongated electrical conductor near an edge of each one of said first electrodes adjacent the space between each adjacent pair of said first electrodes,
    (c) forming at least one elongated insulator proximate a respective said conductor,
    (d) forming a continuous semiconductor photo-active layer on said substrate so as to cover said plurality of first electrodes,
    (e) forming a continuous second electrode on said semiconductor photo-active layer,
    (f) separating said semiconductor photo-active layer and said second electrode into portions corresponding to each photoelectric conversion cell by irradiating an energy beam onto said insulator from above each said second electrode, and
    (g) connecting the second electrode of each photoelectric conversion cell to the first electrode of an adjacent photoelectric conversion cell through said conductor by irradiating an energy beam onto each said conductor from above each said second electrode.

12. A method in accordance with claim 11, wherein said step (b) comprises forming said conductor under said first electrode.

13. A method in accordance with claim 12, wherein said step (a) is performed after said conductor is formed on said insulating surface of said substrate at a predetermined position.

14. A method in accordance with claim 11, wherein said step (c) comprises forming said insulator under said semiconductor photo-active layer.

15. A method in accordance with claim 14, wherein said step (d) comprises forming said semiconductor photo-active layer after said conductor is formed.

16. A method in accordance with claim 11, wherein said step (a) comprises forming a first electrode layer on the whole of said insulating surface of said substrate and separating the first electrode layer into a plurality of spaced first electrodes corresponding to a plurality of said photoelectric conversion cells, and said step (b) comprises forming said conductor on each one of said first electrodes.

17. A method in accordance with claim 16, wherein said step (b) comprises forming a conductor paste on each first electrode and sintering the formed conductor paste.

18. A method in accordance with claim 17, wherein said forming step comprises printing the conductor paste.

19. A method in accordance with claim 18, wherein said printing step comprises printing a metal paste.

20. A method in accordance with claim 19, wherein said printing step comprises printing a silver paste.

21. A method in accordance with claim 11, wherein said step (c) comprises forming a said insulator on each said first electrode.

22. A method in accordance with claim 21, wherein said forming step comprises forming an insulating paste on each said first electrode and sintering the formed insulating paste.

23. A method in accordance with claim 22, wherein said step for forming an insulating paste comprises printing an insulating paste.

24. A method in accordance with claim 23, wherein said printing step comprises printing a paste of inorganic material.

25. A method in accordance with claim 24, wherein said printing step comprises printing a glass paste.

26. A method in accordance with claim 11, wherein in said step (c), said insulator is formed so that it extends in the direction of length of said first electrode and extends beyond said first electrode in the direction of length.

27. A method in accordance with claim 11, wherein in said step (b), said conductor is formed so that it extends along the length of said first electrode and terminates inwardly of the first electrode in the direction of length, and in said step (c), said insulator is formed so that it extends beyond said first electrode in the direction of length.

28. A method in accordance with claim 27, wherein said conductor and said insulator are formed in parallel with each other with a space therebetween in the direction of width of said photoelectric conversion cell, and said step (f) employs a first energy beam and said step (g) employs a second energy beam.

29. A method in accordance with claim 27, wherein said conductor and said insulator are formed in contact with each other, and said steps (f) and (g) are accomplished by one irradiation of an energy beam.

30. A method in accordance with claim 27, wherein a pair of said insulators is formed so as to sandwich each said conductor, and said steps (f) and (g) are accomplished by one irradiation of an energy beam.

31. A method in accordance with claim 30, wherein one of said insulators sandwiching said conductor is formed in the space between said first electrodes.

32. A method in accordance with claim 11, wherein in said step (b), each said conductor is formed so as to extend in the direction of length of each said first electrode, and the end thereof is positioned inside from the edge of the first electrode at the end of said first electrode in the direction of length.

33. In a photovoltaic device of the type including a plurality of photoelectric conversion cells formed on a substrate having an insulating surface:
a plurality of spaced-apart first electrodes formed on said insulating surface of said substrate at locations corresponding to separate photoelectric conversion cells;
an elongated electrical conductor formed in contact with each said first electrode and near an edge thereof adjacent the space between two adjacent said first electrodes;
at least one elongated insulator each formed so as to be proximate a respective one of said conductors; and
a semiconductor photo-active layer formed on said substrate so as to cover said first electrodes and said conductors.

34. A photovoltaic device in accordance with claim 33 further comprising a plurality of second electrodes formed on said semiconductor photo-active layer, the second electrode of each photoelectric conversion cell being connected through said conductor to the first electrode of an adjacent photoelectric conversion cell.

35. In a method for manufacturing a photovoltaic device on a substrate having an insulating surface, the steps of:
forming a plurality of spaced-apart first electrodes corresponding to a plurality of photoelectric conversion cells on said insulating surface of said substrate;
forming an elongated electrical conductor near an edge of each one of said first electrodes adjacent the space between two adjacent said first electrodes;
forming at least one elongated insulator proximate a respective said conductor; and
forming a continuous semiconductor photo-active layer on said substrate so as to cover said plurality of first electrodes.

36. The method of claim 35 further comprising the steps of:
forming a continuous second electrode on said semiconductor photo-active layer;
separating said semiconductor photo-active layer and said second electrode into portions corresponding to individual photoelectric conversion cells; and
connecting the second electrode of each photoelectric conversion cell to the first electrode of an adjacent photoelectric conversion cell through said conductor.

* * * * *